(12) United States Patent
Juds et al.

(10) Patent No.: US 8,163,574 B2
(45) Date of Patent: Apr. 24, 2012

(54) SYSTEM AND METHOD FOR SENSING VOLTAGE IN MEDIUM-TO-HIGH VOLTAGE APPLICATIONS

(75) Inventors: Mark Allan Juds, New Berlin, WI (US); Paul J. Rollmann, Brown Deer, WI (US); Xin Zhou, Wexford, PA (US); James J. Benke, Pittsburgh, PA (US); Birger Pahl, Milwaukee, WI (US); Francois Marchand, Mendham, NJ (US)

(73) Assignee: Eaton Corporaton, Cleveland, OH (US)

( * ) Notice: Subject to any disclaimer, the term of this patent is extended or adjusted under 35 U.S.C. 154(b) by 310 days.

(21) Appl. No.: 12/463,249

(22) Filed: May 8, 2009

(65) Prior Publication Data

US 2010/0283487 A1    Nov. 11, 2010

(51) Int. Cl.
*H01L 21/66* (2006.01)
*H01L 23/58* (2006.01)

(52) U.S. Cl. ............... 438/16; 257/48; 257/E23.011

(58) Field of Classification Search ............ 257/594, 257/595, 602, 688, 687, 779, 780, 737, 738, 257/E23.011, 48, 79; 438/11, 14–18; 324/688, 324/663–664, 667
See application file for complete search history.

(56) References Cited

U.S. PATENT DOCUMENTS

| | | | |
|---|---|---|---|
| 3,835,353 A | 9/1974 | Hermstein et al. |
| 3,939,412 A | 2/1976 | Hermstein et al. |
| 3,942,099 A | 3/1976 | Freygang et al. |
| 3,974,440 A | 8/1976 | Schiemann et al. |
| 4,121,154 A | 10/1978 | Keating |
| 4,553,099 A * | 11/1985 | Kasahara et al. ............ 324/458 |
| 4,611,207 A | 9/1986 | Anderson et al. |
| 4,617,513 A | 10/1986 | Reinhardt |
| 4,739,254 A | 4/1988 | Henry et al. |
| 5,017,859 A | 5/1991 | Engel et al. |
| 5,432,438 A | 7/1995 | Baumgartner et al. |
| 5,488,301 A | 1/1996 | Werner, Jr. et al. |
| 6,205,039 B1 | 3/2001 | Astrom et al. |
| 7,123,032 B2 | 10/2006 | Yakymyshyn et al. |
| 7,126,348 B2 | 10/2006 | Adolfsson et al. |
| 7,129,693 B2 | 10/2006 | Yakymyshyn et al. |
| 7,218,493 B2 | 5/2007 | Colombo et al. |
| 7,280,338 B2 | 10/2007 | Juds et al. |

(Continued)

FOREIGN PATENT DOCUMENTS

CN    1538181 A    1/2006

(Continued)

OTHER PUBLICATIONS

ABB PowerIT Indoor Combi Sensor, KEVCY_R.

(Continued)

*Primary Examiner* — Hoa B Trinh
(74) *Attorney, Agent, or Firm* — Ziolkowski Patent Solutions Group, SC

(57) ABSTRACT

A system and method for measuring voltage of a medium to high voltage line conductor is disclosed. The system includes an electrical insulator having a surface and an edge, the surface having an opening therein to allow passage of a line conductor therethrough in a direction generally perpendicular to the surface. The system also includes first and second electrodes positioned about the opening on the surface of the electrical insulator and spaced apart from one another to provide a common capacitive divider signal indicative of a voltage potential of the line conductor.

20 Claims, 5 Drawing Sheets

U.S. PATENT DOCUMENTS

2005/0001489 A1    1/2005    Gemme et al.

FOREIGN PATENT DOCUMENTS

| | | |
|---|---|---|
| EP | 0464021 B1 | 1/1992 |
| EP | 0522303 A2 | 1/1993 |
| EP | 0570148 A2 | 11/1993 |
| EP | 0631144 A1 | 12/1994 |
| EP | 1018028 B1 | 7/2000 |
| WO | 9407149 A1 | 3/1994 |
| WO | 9527297 A1 | 10/1995 |
| WO | 0157979 A1 | 8/2001 |
| WO | 0194956 A1 | 12/2001 |
| WO | WO2005069020 A1 | 7/2005 |
| WO | 2006007456 A2 | 1/2006 |

OTHER PUBLICATIONS

ABB V-I Sensor.
Nu-Lec Industries, W-Series Solid Dielectric Single Phase Recloser, 2004.
Pearson Electronics, Inc., Model VD-305A Capacitive Voltage Divider, 1992.
Ross Engineering Corporation, Hugh C. Ross, Voltage Sensing, Measurement & Phasing, 2007, http://www.rossengineeringcorp.com/voltage_sensing_phasing.htm.

* cited by examiner

SYSTEM AND METHOD FOR SENSING VOLTAGE IN MEDIUM-TO-HIGH VOLTAGE APPLICATIONS

BACKGROUND OF THE INVENTION

The present invention relates generally to voltage sensors for use with line conductors and, more particularly, to a compact capacitive divider-type sensor that is easy to manufacture and capable of measuring the potential of a medium-to-high voltage line conductor.

Capacitive divider-type sensors measure the AC voltage of a line conductor or bus bar. In such a device, a first capacitor (C1) with a known capacitance is connected to the line conductor. A second capacitor (C2) with a capacitance larger than the first is connected in series between C1 and ground. The voltage ($V_{C2}$) across C2 is proportional to the line voltage ($V_L$) between the line conductor and ground. Specifically, $V_L$ may be determined using the following equation:

$$V_{C2}=V_L(C1/(C1+C2)).$$

When constructing a capacitive divider capable of measuring voltage in medium voltage (MV) to high voltage (HV) applications (e.g., approximately 1 kV to 50 kV), numerous design factors are typically taken into account. For example, both C1 and C2 are typically constructed using a number of individual capacitors to reduce the voltage on both C1 and C2 to a value that is within each capacitor's voltage rating. Such individual components, however, significantly increase complexity, inaccuracy possibilities, and manufacturing costs to the capacitive divider.

Also, the electric field (E-field) concentration on individual components of the capacitive divider influences the design of the capacitive divider. As is known, E-field concentration is, in part, a factor of the voltage of the line conductor. That is, as the voltage of the line conductor increases, E-field concentration on the individual components of the capacitive divider may increase as well. When E-field concentration is high, dielectric breakdown may occur between the line conductor and the voltage sensor. While E-field concentration may be minimized by increasing the distance between individual components of the capacitive divider, such an increase in component spacing also increases the overall size of the device.

It would therefore be desirable to design an apparatus and method for measuring the voltage of a medium-to-high voltage line conductor that is small, accurate, and relatively inexpensive to manufacture.

BRIEF DESCRIPTION OF THE INVENTION

The present invention provides a system and method for sensing the voltage of a medium or high voltage line conductor. Therefore, in accordance with one aspect of the present invention, a voltage sensor for a line conductor includes an electrical insulator comprising a surface and an edge, the surface having a length and the edge having a thickness defining a thickness of the electrical insulator. The length of the surface of the electrical insulator is substantially greater than the thickness of the edge. The surface of the electrical insulator has an opening therein to allow passage of a line conductor therethrough in a direction generally perpendicular to the surface. The voltage sensor also includes first and second electrodes positioned about the opening on the surface of the electrical insulator and spaced apart from one another to provide a common capacitive divider signal indicative of a voltage potential of the line conductor.

In accordance with another aspect of the invention, a method of manufacturing a line sensor includes providing an insulating substrate having an attachment surface and having an opening therein to allow a line conductor to pass through in a direction generally perpendicular to the attachment surface. The method also includes coupling first and second electrodes of an electrode assembly to the attachment surface of the insulating substrate, spacing the first and second electrodes of the electrode assembly apart from one another on the insulating substrate, and configuring the electrode assembly to output a signal indicative of a voltage potential of the line conductor.

In accordance with yet another aspect of the invention, a voltage sensor for a line conductor includes an electrically insulating substrate having a contact surface, the contact surface having an opening sized to allow a line conductor to pass therethrough in a direction generally perpendicular to the contact surface. The line conductor also includes a sensor electrode coupled to the contact surface of the electrically insulating substrate and a grounded electrode coupled to the contact surface of the electrically insulating substrate. The sensor electrode and the grounded electrode form elements of a capacitive divider and produce a common output.

Various other features and advantages of the present invention will be made apparent from the following detailed description and the drawings.

BRIEF DESCRIPTION OF THE DRAWINGS

The drawings illustrate preferred embodiments presently contemplated for carrying out the invention.

In the Drawings.

DETAILED DESCRIPTION

Figure 1:
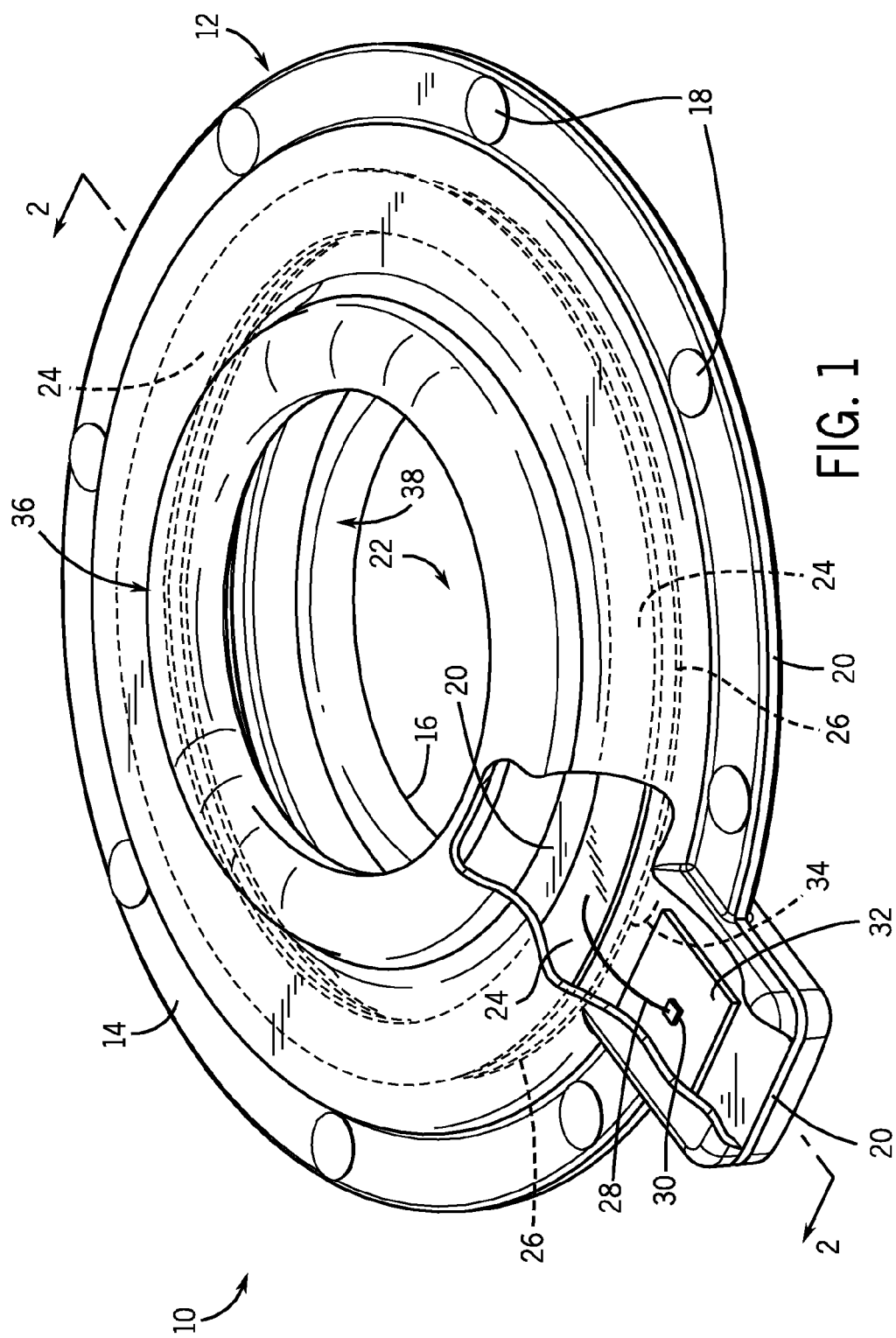
FIG. 1 is a perspective view of a voltage sensor according to an embodiment of the invention.

The embodiments of the invention set forth herein relate to a system and method for sensing voltage of a medium or high voltage line conductor. In one embodiment, the invention is implemented with a voltage sensor having two capacitors in series formed therein. A voltage sensor 10 is shown in FIG. 1 and includes a grounded voltage sensor shield 12, which may be constructed of injected-molded plastic plated with a metal, such as, for example, nickel and/or copper. Other alternatives include stamped metal, a metal mesh/screen, or a combination of the aforementioned materials. Sensor shield 12 is a faraday shield having a generally circular shape. In one embodiment, sensor shield 12 may be constructed having a top shield 14 and a bottom shield 16 fastened together with rivets 18. An electrical insulator or electrically insulating substrate 20 having a generally disk shape is positioned between top and bottom shields 14, 16. Electrical insulator 20 has an opening 22 therein to receive a line conductor (not shown in FIG. 1). In a preferred embodiment, electrical insulator 20 is a printed circuit board (PCB). Alternatively, electrical insulator 20 may be a thin (approximately 0.002 in), insulated support sheet comprising a material such as, for example, Kapton.

A first or sensor electrode 24 and a second or grounded electrode 26 are affixed to or formed on support plate 20 about the opening of 22 electrical insulator 20. In one embodiment, first and second electrodes 24, 26 are formed using a printing, painting, electro-deposition, or metal spraying process to deposit a layer of conductive material such as copper, for example, on electrical insulator 20. Wired connection 28 connects first electrode 24 to a contact pad 30 of a readout circuit 32, which will be described in more detail with respect to FIGS. 2 and 3. Wired connection 34 connects second electrode 26 to grounded voltage sensor shield 12.

As shown in FIG. 1, radius corners or edge portions 36, 38 of top and bottom shields 14, 16 have a curved profile, which minimizes electric-field concentration and arcing on edge portions 36, 38 and helps to prevent dielectric breakdown. Alternatively, curled edge portions 36, 38 may be formed by attaching a large diameter wire ring to top and bottom shields 14, 16. The curvature of edge portion 36, 38 also allows first and second electrodes 24, 26 to be placed closer to a line conductor, therefore decreasing the overall size of voltage sensor 10.

Figure 2:
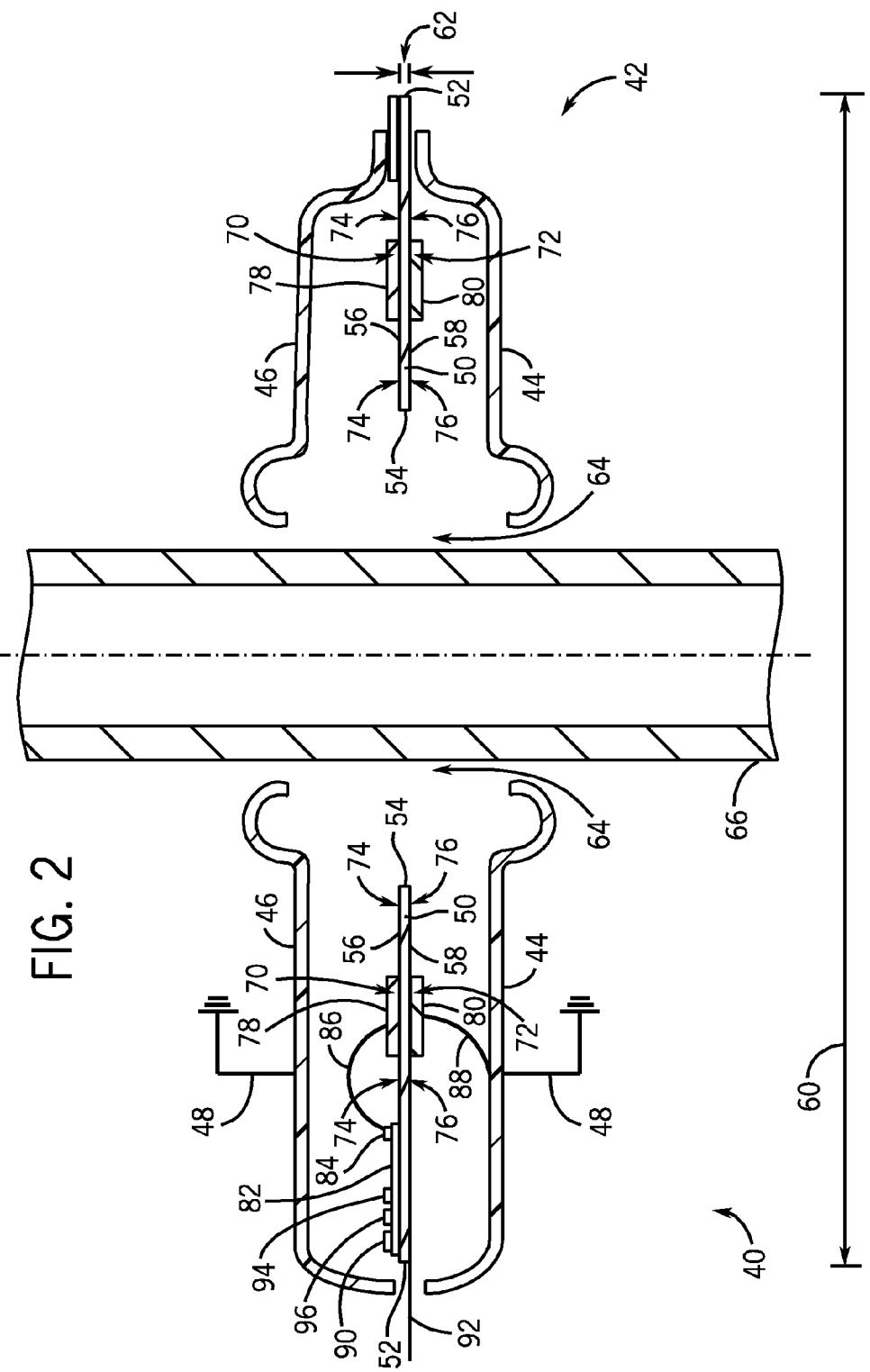
FIG. 2 is a cross-sectional view of the voltage sensor of FIG. 1.

Referring now to FIG. 2, a cross-sectional view of a voltage sensor 40 is shown according to one embodiment of the invention. Voltage sensor 40 includes a shield assembly 42 having a first shield 44 and a second shield 46 connected to ground 48. A printed circuit board (PCB) 50 is positioned between first shield 44 and second shield 46. PCB 50 has a top edge 52, a bottom edge 54, a first side surface or attachment surface 56, and a second side surface or attachment surface 58. As shown in FIG. 2, PCB 50 has an overall length 60 much larger than a thickness 62 thereof. An opening 64 in PCB 50 allows a line conductor 66 to pass therethrough. PCB 50 is positioned such that top edge 52 and bottom edge 54 are oriented substantially parallel to a central axis 68 of line conductor 66. First side surface 56 and second side surface 58 of PCB 50 are oriented substantially perpendicular to central axis 68 of line conductor 66 and have respective contact locations 70, 72 and a number of respective non-contact locations 74, 76 positioned thereon. A sensor electrode 78 is affixed to first side surface 56 of PCB 50 at contact location 70, and a grounded electrode 80 is affixed to second side surface 58 of PCB 50 at contact location 72. As shown in FIG. 2, sensor electrode 78 and grounded electrode 80 are located equidistant to opening 64 of PCB 50 and line conductor 66. Alternatively, electrodes 78, 80 may be offset from each other on PCB 50 such that one of sensor electrode 78 and grounded electrode 80 is closer to line conductor 66 than the other.

Also affixed to PCB 50 is a readout circuit 82 having a contact pad 84 positioned thereon. Sensor wire 86 electrically connects sensor electrode 78 to contact pad 84. Ground wire 88 grounds electrode 80 via a connection to first shield 44. Readout circuit 82 buffers the high impedance of voltage sensor 40 and includes a buffer and amplifier circuit 90 to amplify signals from sensor electrode 78 for a voltage sensor output 92. Because dielectric constants are temperature sensitive, a thermocouple 94 and a microprocessor 96 may also be included on readout circuit 82 such that a dielectric constant may be corrected as a function of temperature.

Figure 3:
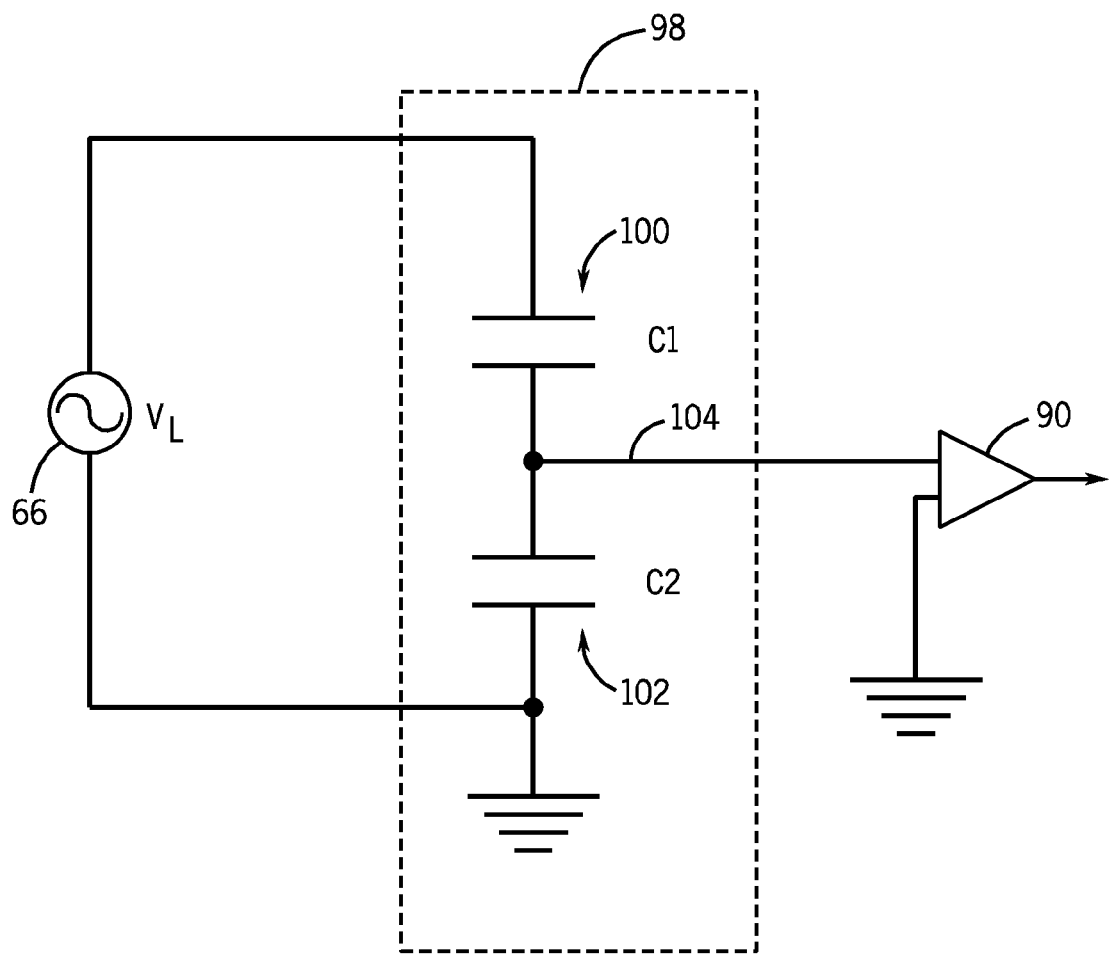
FIG. 3 is an equivalent circuit of a capacitive divider according to an embodiment of the invention.

A schematic circuit diagram of voltage sensor embodiments of the invention is shown in FIG. 3. Referring to FIGS. 2 and 3, a capacitive divider 98 is formed between line conductor 66, sensor electrode 78, and grounded electrode 80. A first capacitor (C1) 100 is formed between line conductor ($V_L$) 66 and sensor electrode 78. As is known, the capacitance of C1 100 may be controlled by selectively sizing sensor electrode 78 and setting the distance between sensor electrode 78 and line conductor 66. In one embodiment, the capacitance of C1 100 may be approximately 10 fF. A second capacitor (C2) 102 is formed between sensor electrode 78 and grounded electrode 80. Similar to that explained with respect to C1 100, the capacitance of C2 102 may be selected based on the size and position of both sensor electrode 78 and grounded electrode 80. In one embodiment, the capacitance of C2 102 may be approximately 100 pF. A buffer and amplifier circuit 90 mounted on readout circuit 82 amplifies a sensed voltage potential signal 104 proportional to the sensed voltage from capacitive divider 98 and transmits a signal indicative of a voltage potential of line conductor 66 to an external trip unit (not shown). In one embodiment, the ratio between the sensed voltage signal 104 and $V_L$ 66 is 1:10,000 or 100 mV/kV.

Figure 4:
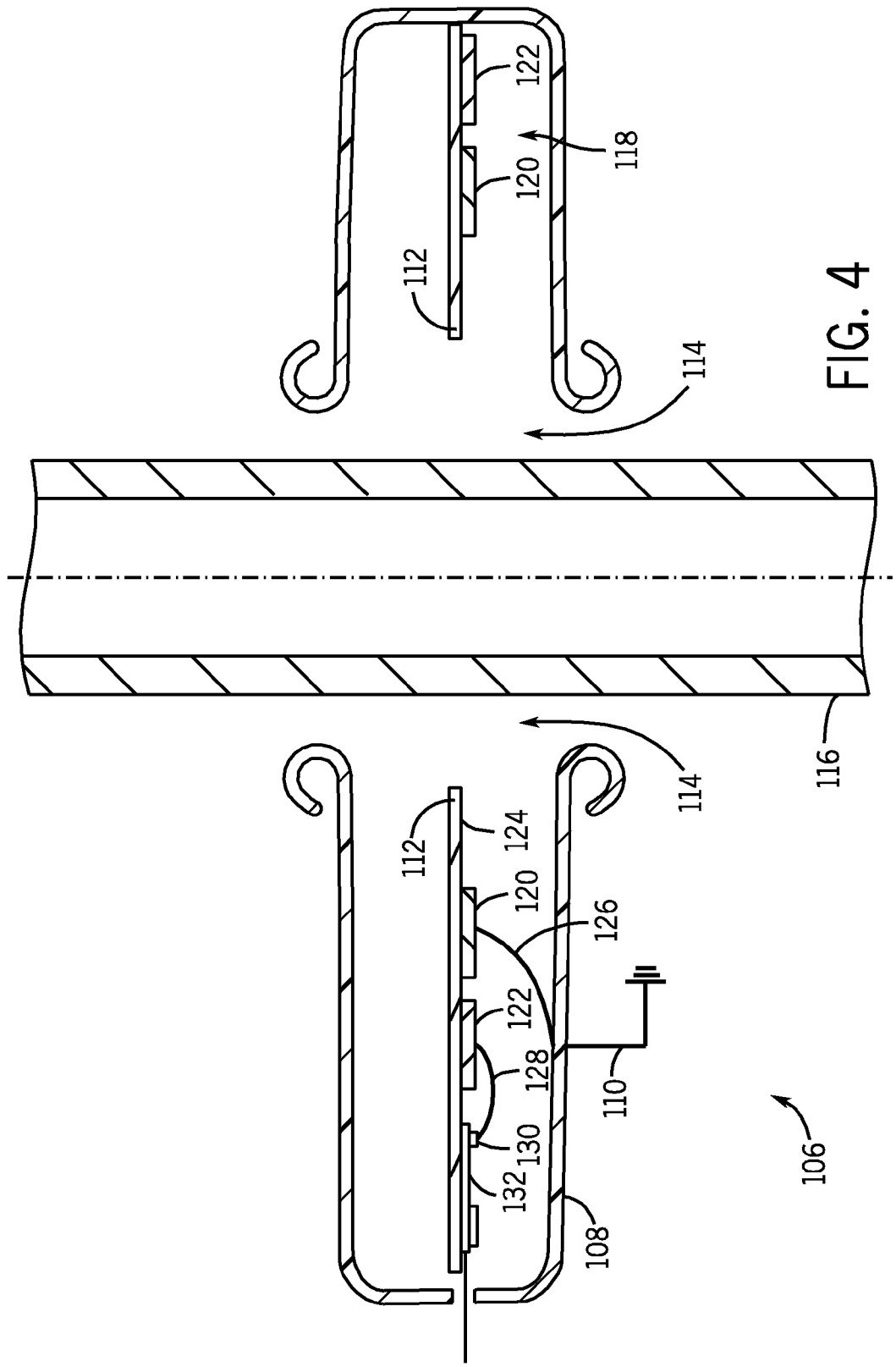
FIG. 4 is a cross-sectional view of a voltage sensor according to another embodiment of the invention.

FIG. 4 shows a cross-section of a voltage sensor 106 according to another embodiment of the invention. A sensor shield or shield ring 108 is connected to ground 110 and forms a continuous piece of metal or metal-plated plastic that surrounds a PCB 112. PCB 112 has a passage 114 formed therein to receive a line conductor 116. An electrode assembly 118 comprising a sensor electrode 120 and a grounded electrode 122 are positioned on a common planar contact surface 124 of PCB 112. Wired connection 126 grounds electrode 122 via a connection to grounded shield ring 108. Wired connection 128 electrically connects to contact pad 130 of a readout circuit 132.

Figure 5:
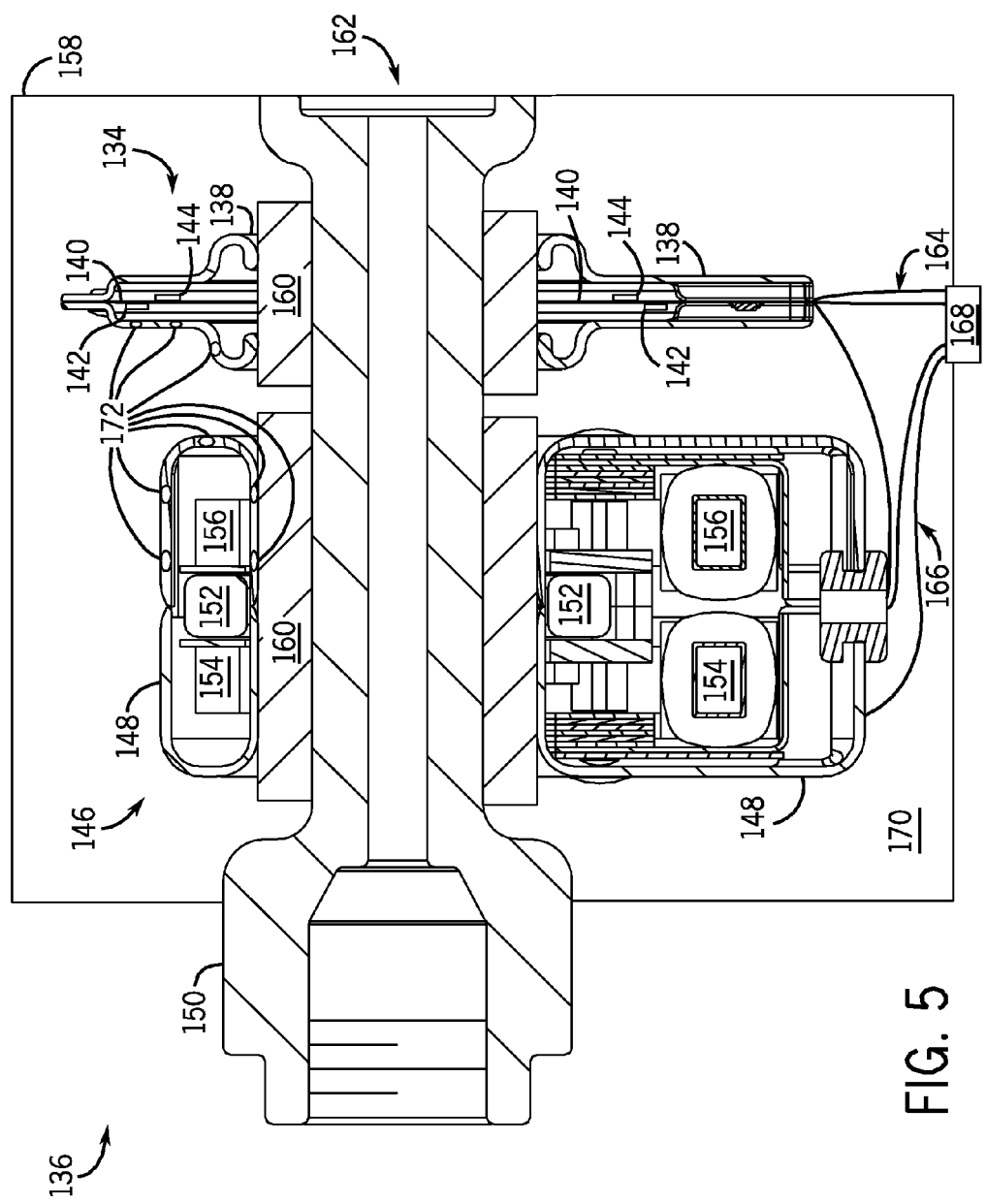
FIG. 5 is a cross-sectional view of a sensor assembly according to an embodiment of the invention.

As shown in FIG. 5 according to one embodiment of the invention, a voltage sensor 134 may be incorporated within a sensor assembly 136. Voltage sensor 134 includes a voltage shield or housing 138, a PCB 140, and first and second electrodes 142, 144. In addition to voltage sensor 134, sensor assembly 136 also includes a current sensor assembly 146 having a housing or shield 148 to prevent dielectric breakdown from a line conductor 150. Shield 148 surrounds a current sensor 152 and first and second parasitic power current transformers (CT) 154, 156. According to one embodiment, current sensor 152 is a Rogowski coil that detects the current in line conductor 150. CTs 154, 156 parasitically generate power from either the line current or line voltage and provide power to voltage sensor 134 and to the external trip unit (not shown).

Voltage sensor 134 and current sensor assembly 146 are positioned in a housing or common structure 158 with spacers 160. While spacers 160 are shown as solid cylinders, alternate embodiments may only have a few minimal support points for equal effectiveness. A passage 162 in housing 158 is sized to receive line conductor 150. Wired connections 164, 166 from voltage sensor 134 and current sensor assembly 146, respectively, connect to a multi-pin connector 168, which allows transmission of sensor signals from the voltage sensor 134 and current sensor 152 to an external trip unit (not shown).

In one embodiment, an insulating material or encapsulant 170, such as an epoxy with a high dielectric breakdown strength, for example, forms a dielectric within housing 158. Insulating material 170 minimizes dielectric breakdown between line conductor 150 and the shields 138, 148, and also between voltage sensor 134 and current sensor assembly 146. Insulating material 170 is injected into housing 158 to encapsulate voltage sensor 134 and current sensor assembly 146 and fill any air gaps within voltage sensor 134 and current sensor assembly 146. Vent holes 172 in both current shield 148 and voltage shield 138 allow air to escape during encapsulation.

Therefore, in accordance with one aspect of the present invention, a voltage sensor for a line conductor includes an electrical insulator comprising a surface and an edge, the surface having a length and the edge having a thickness defining a thickness of the electrical insulator. The length of the surface of the electrical insulator is substantially greater than the thickness of the edge. The surface of the electrical insulator has an opening therein to allow passage of a line conductor therethrough in a direction generally perpendicular to the surface. The voltage sensor also includes first and second electrodes positioned about the opening on the surface of the electrical insulator and spaced apart from one another to provide a common capacitive divider signal indicative of a voltage potential of the line conductor.

In accordance with another aspect of the invention, a method of manufacturing a line sensor includes providing an insulating substrate having an attachment surface and having an opening therein to allow a line conductor to pass through in a direction generally perpendicular to the attachment surface. The method also includes coupling first and second electrodes of an electrode assembly to the attachment surface of the insulating substrate, spacing the first and second electrodes of the electrode assembly apart from one another on the insulating substrate, and configuring the electrode assembly to output a signal indicative of a voltage potential of the line conductor.

In accordance with yet another aspect of the invention, a voltage sensor for a line conductor includes an electrically insulating substrate having a contact surface, the contact surface having an opening sized to allow a line conductor to pass therethrough in a direction generally perpendicular to the contact surface. The line conductor also includes a sensor electrode coupled to the contact surface of the electrically insulating substrate and a grounded electrode coupled to the contact surface of the electrically insulating substrate. The sensor electrode and the grounded electrode form elements of a capacitive divider and produce a common output.

The present invention has been described in terms of the preferred embodiment, and it is recognized that equivalents, alternatives, and modifications, aside from those expressly stated, are possible and within the scope of the appending claims.

What is claimed is:

1. A voltage sensor for a line conductor comprising:
an electrical insulator comprising a surface and an edge, the surface having a length and the edge having a thickness defining a thickness of the electrical insulator, wherein the length of the surface is substantially greater than the thickness of the edge, the surface of the electrical insulator having an opening therein to allow passage of a line conductor therethrough in a direction generally perpendicular to the surface; and
first and second electrodes positioned about the opening on the surface of the electrical insulator and spaced apart from one another to provide a common capacitive divider signal indicative of a voltage potential of the line conductor; and a housing positioned about the electrical insulator and the first and second electrodes; wherein the housing has at least one radius edge portion which provides arc reduction between the line conductor and the housing.

2. The voltage sensor of claim 1 wherein the electrical insulator has two surfaces, each having thereon a respective electrode.

3. The voltage sensor of claim 2 wherein the first electrode and the second electrode are positioned equidistant to the line conductor.

4. The voltage sensor of claim 1 wherein both first and second electrodes are on a common planar surface.

5. The voltage sensor of claim 1 further comprising a buffer and amplifier circuit, and wherein the first electrode is connected to the buffer and the amplifier circuit and the second electrode is connected to a common ground.

6. The voltage sensor of claim 1 wherein the first electrode is positioned at a first distance from the line conductor and the second electrode is positioned at a second distance from the line conductor different from the first distance.

7. The voltage sensor of claim 1 further comprising a current sensor integrated into a common structure with the voltage sensor.

8. The voltage sensor of claim 1 wherein the housing is at ground potential and has a dielectric between the voltage sensor and the housing.

9. A method of manufacturing a line sensor comprising:
providing an insulating substrate having an attachment surface and having an opening therein to allow a line conductor to pass through in a direction generally perpendicular to the attachment surface;
coupling first and second electrodes of an electrode assembly to the attachment surface of the insulating substrate;
spacing the first and second electrodes of the electrode assembly apart from one another on the insulating substrate; and
configuring the electrode assembly to output a signal indicative of a voltage potential of the line conductor; and positioning a housing about the insulating substrate and the electrode assembly, the housing having at least one radius edge portion which provides arc reduction between the line conductor and the housing.

10. The method of claim 9 wherein spacing the first and second electrodes apart from one another on the attachment surface comprises positioning the first and second electrodes on a common attachment surface.

11. The method of claim 9 wherein spacing the first and second electrodes apart from one another on the attachment surface comprises positioning the first and second electrodes equidistant to the opening of the attachment surface.

12. The method of claim 10 further comprising positioning a common structure about the housing.

13. The method of claim 12 further comprising injecting an encapsulant between the housing and the common structure.

14. The method of claim 13 further comprising ventilating air from within the common structure when injecting the encapsulant.

15. The method of claim 12 further comprising positioning a current sensor within the housing.

16. The method of claim 9 further comprising configuring a readout circuit to output the signal indicative of a voltage potential of the line conductor.

17. A voltage sensor for a line conductor comprising:
an electrically insulating substrate having a contact surface, the contact surface having an opening sized to allow a line conductor to pass therethrough in a direction generally perpendicular to the contact surface;
a sensor electrode coupled to the contact surface of the electrically insulating substrate;
a grounded electrode coupled to the contact surface of the electrically insulating substrate; and a grounded shield ring having curved surface contours to reduce arcing between the line conductor and the grounded shield ring; and wherein the sensor electrode and the grounded electrode form elements of a capacitive divider and produce a common output.

18. The voltage sensor of claim 17 wherein the grounded shield ring substantially surrounds the electrically insulating substrate, the sensor electrode, and the grounded electrode.

19. The voltage sensor of claim 17 wherein the electrically insulating substrate is a printed circuit board and has a generally disk shape.

20. The voltage sensor of claim 19 further comprising a readout circuit coupled to the electrically insulating substrate and configured to output a signal indicating a voltage potential of the line conductor.

* * * * *